United States Patent
Zhao et al.

(10) Patent No.: US 10,077,189 B2
(45) Date of Patent: Sep. 18, 2018

(54) METHOD OF MODIFYING ELECTRICAL PROPERTIES OF CARBON NANOTUBES USING NANOPARTICLES

(75) Inventors: Jianwen Zhao, Singapore (SG); Lain-Jong Li, Singapore (SG); Peng Chen, Singapore (SG); Bee Eng Mary Chan, Singapore (SG)

(73) Assignee: NANYANG TECHNOLOGICAL UNIVERSITY, Singapore (SG)

( * ) Notice: Subject to any disclaimer, the term of this patent is extended or adjusted under 35 U.S.C. 154(b) by 13 days.

(21) Appl. No.: 13/577,223

(22) PCT Filed: Feb. 7, 2011

(86) PCT No.: PCT/SG2011/000053
§ 371 (c)(1),
(2), (4) Date: Oct. 26, 2012

(87) PCT Pub. No.: WO2011/096898
PCT Pub. Date: Aug. 11, 2011

(65) Prior Publication Data
US 2013/0040439 A1   Feb. 14, 2013

Related U.S. Application Data

(60) Provisional application No. 61/301,791, filed on Feb. 5, 2010.

(51) Int. Cl.
*H01L 51/00* (2006.01)
*B82Y 10/00* (2011.01)
(Continued)

(52) U.S. Cl.
CPC .............. *B82Y 10/00* (2013.01); *B82Y 30/00* (2013.01); *B82Y 40/00* (2013.01); *C09D 7/62* (2018.01);
(Continued)

(58) Field of Classification Search
CPC . H01L 51/0048; H01L 51/0558; B82Y 10/00; C09D 7/62
See application file for complete search history.

(56) References Cited

U.S. PATENT DOCUMENTS

2007/0108068 A1* 5/2007 Suh .................. B82Y 30/00
205/766
2007/0265379 A1* 11/2007 Chen et al. ................ 524/404
(Continued)

FOREIGN PATENT DOCUMENTS

WO   WO 2008/048192    * 4/2008  ............ C01B 31/08
WO   2009/122149 A1   10/2009

OTHER PUBLICATIONS

Ci et al., "Continuous Carbon Nanotube Reinforced Composites," Nano Letters, 8, 2762-2766, 2008.*
(Continued)

*Primary Examiner* — Julia Slutsker
(74) *Attorney, Agent, or Firm* — Seed IP Law Group LLP

(57) ABSTRACT

Various embodiments relate to a method of modifying the electrical properties of carbon nanotubes. The method may include providing a substrate having carbon nanotubes deposited on a surface of the substrate, and depositing on the carbon nanotubes a coating layer comprising a mixture of nanoparticles, a matrix in which the nanoparticles are dissolved or stabilized, and an ionic liquid. A field-effect transistor including the modified carbon nanotubes is also provided.

18 Claims, 8 Drawing Sheets

(51) Int. Cl.
| | |
|---|---|
| B82Y 30/00 | (2011.01) |
| B82Y 40/00 | (2011.01) |
| H01L 51/05 | (2006.01) |
| C09D 7/62 | (2018.01) |
| C08K 3/04 | (2006.01) |
| C08K 9/02 | (2006.01) |

(52) U.S. Cl.
CPC ...... *H01L 51/0049* (2013.01); *H01L 51/0558* (2013.01); *C08K 3/04* (2013.01); *C08K 9/02* (2013.01)

(56) References Cited

U.S. PATENT DOCUMENTS

| | | | | |
|---|---|---|---|---|
| 2008/0012155 | A1* | 1/2008 | Raravikar | B82Y 10/00 257/789 |
| 2008/0311380 | A1* | 12/2008 | Agrawal | 428/323 |
| 2009/0252967 | A1 | 10/2009 | Yoon et al. | |
| 2010/0035047 | A1* | 2/2010 | Ajayan et al. | 428/328 |
| 2010/0291374 | A1* | 11/2010 | Akarsu | B82Y 20/00 428/328 |
| 2011/0053050 | A1* | 3/2011 | Lim et al. | 429/524 |
| 2011/0081770 | A1* | 4/2011 | Tombler, Jr. | 438/466 |

OTHER PUBLICATIONS

Sanes et al., "Effect of the addition of room temperature ionic liquid and ZnO nanoparticles on the wear and scratch resistance of epoxy resin," Wear 268 (2010), pp. 1295-1302.*

Wu et al., "Functionalization of Carbon Nanotubes by an Ionic-Liquid Polymer: Dispersion of Pt and PtRu Nanoparticles on Carbon Nanotubes and Their Electrocatalytic Oxidation of Methanol," Angew. Chem. Int. Ed. 2009, 48, 4751-4754.*

M. Przybyszewska and M. Zaborski, "Effect of Ionic Liquids and Surfactants on Zinc Oxide Nanoparticle Activity in Crosslinking of Acrylonitrile Butadiene Elastomer," Journal of Applied Polymer Science, vol. 116, 155-164, (2010).*

Das et al., "Coupling activity of ionic liquids between diene elastomers and multi-walled carbon nanotubes," Carbon 47, (2009), pp. 3313-3321.*

Sekitani et al., "A Rubberlike Stretchable Active Matrix Using Elastic Conductors, " Science 321, (2008), pp. 1468-1472.*

Fukushima et al., "Ionic Liquids for Soft Functional Materials with Carbon Nanotubes, " Chem. Eur. J. 13, (2007), pp. 5048-5058.*

Adam et al., "A self-consistent theory for graphene transport," PNAS 104(47):18392-18397, Nov. 20, 2007.

An et al., "A Simple Chemical Route to Selectively Eliminate Metallic Carbon Nanotubes in Nanotube Network Devices," *J. Am. Chem. Soc.* 126:10520-10521, 2004.

Arnold et al., "Sorting carbon nanotubes by electronic structure using density differentiation," *Nature Nanotechnology* 1:60-65, Oct. 2006.

Artukovic et al., "Transparent and Flexible Carbon Nanotube Transistors," *Nano Letters* 5(4):757-760, 2005.

Bachilo et al., "Narrow (n,m)-Distribution of Single-Walled Carbon Nanotubes Grown Using a Solid Supported Catalyst," *J. Am. Chem. Soc.* 125:11186-11187, 2003.

Balasubramanian et al., "A Selective Electrochemical Approach to Carbon Nanotube Field-Effect Transistors," *Nano Letters* 4(5):827-830, 2004.

Beigbeder et al., "CH-π Interactions as the Driving Force for Silicone-Based Nanocomposites with Exceptional Prosperities," *Advanced Materials* 20:1003-1007, 2008.

Cao et al., "Highly Bendable, Transparent Thin-Film Transistors That Use Carbon-Nanotube-Based Conductors and Semiconductors with Elastomeric Dielectrics," *Advanced Materials* 18:304-309, 2006.

Cao et al., "Medium-scale carbon nanotube thin-film integrated circuits on flexible plastic substrates," *Nature Letters* 454:495-500, Jul. 24, 2008.

Chen et al., "Ionic Screening of Charged-Impurity Scattering in Graphene," *Nano Letters* 9(4):1621-1625, 2009.

Chen et al., "Toward the Extraction of Single Species of Single-Walled Carbon Nanotubes Using Fluorene-Based Polymers," *Nano Letters* 7(10):3013-3017, 2007.

Chiang et al., "Linking catalyst composition to chirality distributions of as-grown single-walled carbon nanotubes by tuning $Ni_xFe_{1-x}$ nanoparticles," *Nature Materials* 8:882-886, Nov. 2009.

Collins et al., "Engineering Carbon Nanotubes and Nanotube Circuits Using Electrical Breakdown," *Science* 292:706-709, Apr. 27, 2001.

Ding et al., "Selective Growth of Well-Aligned Semiconducting Single-Walled Carbon Nanotubes," *Nano Letters* 9(2):800-805, 2009.

Engel et al., "Thin Film Nanotube Transistors Based on Self-Assembled, Aligned, Semiconducting Carbon Nanotube Arrays," *ACSNano* 2(12):2445-2452, 2008.

Fuhrer et al., "Crossed Nanotube Junctions," *Science* 288:494-497, 2000.

Johnston et al., "Electronic devices based on purified carbon nanotubes grown by high-pressure decomposition of carbon monoxide," *Nature Materials* 4:589-592, Aug. 2005.

Kanbara et al., "Contact resistance modulation in carbon nanotube devices investigated by four-probe experiments," *Applied Physics Letters* 88:053118, 2006.

Kang et al., "High-performance electronics using dense, perfectly aligned arrays of single-walled carbon nanotubes," *Nature Nanotechnology* 2(4):230-236, 2007.

Kanungo et al., "Suppression of Metallic Conductivity of Single-Walled Carbon Nanotubes by Cycloaddition Reactions," *Science* 323:234-237, Jan. 9, 2009.

Kim et al., "Selective Functionalization and Free Solution Electrophoresis of Single-Walled Carbon Nanotubes: Separate Enrichment of Metallic and Semiconducting SWNT," *Chem. Mater.* 19:1571-1576, 2007.

Kocabas et al., "Experimental and Theoretical Studies of Transport through Large Scale, Partially Aligned Arrays of Single-Walled Carbon Nanotubes in Thin Film Type Transistors," *Nano Letters* 7(5):1195-1202, 2007.

Krupke et al., "Separation of Metallic from Semiconducting Single-Walled Carbon Nanotubes," *Science* 301:344-347, Jul. 18, 2003.

Krupke et al., "Thin Films of Metallic Carbon Nanotubes Prepared by Dielectrophoresis," *Advance Materials* 18:1468-1470, 2006.

Lee et al., "Illumination-Enhanced Hysteresis of Transistors Based on Carbon Nanotube Networks," *The Journal of Physical Chemistry C* 113:4745-4747, 2009.

Lee et al., "Solution-Processable Carbon Nanotubes for Semiconducting Thin-Film Transistor Devices," *Advanced Materials* 22:1278-1282, 2010.

Lee et al., "Toward High-Performance Solution-Processed Carbon Nanotube Network Transistors by Removing Nanotube Bundles," *The Journal of Physical Chemistry B* 112:12089-120191, 2008.

LeMieux et al., "Self-Sorted, Aligned Nanotube Networks for Thin-Film Transistors," *Science* 321:101-103, Jul. 4, 2008.

Li et al., "Influence of Triton X-100 on the characteristics of carbon nanotube field-effect transistors," *Nanotechnology* 17:668-673, 2006.

Li et al., "Preferential growth of Semiconducting Single-Walled Carbon Nanotubes by a Plasma Enhanced CVD Method," *Nano Letters* 4(2):317-321, 2004.

Li et al., "Selective Interactions of Porphyrins with Semiconducting Single-Walled Carbon Nanotubes," *J. Am. Chem. Soc.* 126:1014-1015, 2004.

Maeda et al., "Large-Scale Separation of Metallic and Semiconducting Single-Walled Carbon Nanotubes," *J. Am. Chem. Soc.* 127:10287-10290, 2005.

Miyata et al., "Selective Oxidation of Semiconducting Single-Wall Carbon Nanotubes by Hydrogen Peroxide," *The Journal of Physical Chemistry B* 110:25-29, 2006.

(56) References Cited

OTHER PUBLICATIONS

Okimoto et al., "Ink-Jet Printing of a Single-Walled Carbon Nanotube Thin Film Transistor," *Japanese Journal of Applied Physics* 48:06FF03, 2009.
Pauw, "A Method of Measuring Specific Resistivity and Hall Effect of Discs of Arbitrary Shape," *Philips Research Reports* 13(1):1-9, 1958.
Rinkiii et al., "Effect of humidity on the hysteresis of single walled carbon nanotube field-effect transistors," *Phys. Stat. Sol.* (b) 245(10):2315-2318, 2008.
Ryu et al., "CMOS-Analogous Wafer-Scale Nanotube-on-Insulator Approach for Submicrometer Devices and Integrated Circuits Using Aligned Nanotubes," *Nano Letters* 9(1):189-197, 2009.
Seidel et al., "High-Current nanotube Transistors," *Nano Letters* 4(5):831-834, 2004.
Snow et al., "Random networks of carbon nanotubes as an electronic material," *Applied Physics Letters* 82(13):2145-2147, Mar. 31, 2003.
Song et al., "Inkjet printing of single-walled carbon nanotubes and electrical characterization of the line pattern," *Nanotechnology* 19:095702, 2008.
Strano, "Probing Chiral Selective Reactions Using a revised Kataura Plot for the Interpretation of Single-Walled Carbon nanotube Spectroscopy," *J. Am. Chem. Soc.* 125:16148-16153, 2003.
Strano et al., "Electronic Structure Control of Single-Walled Carbon nanotube Functionalization," *Science* 301:1519-1522, 2003.
Tanaka et al., "Simple and Scalable Gel-Based Separation of Metallic and Semiconducting Carbon Nanotubes," *Nano Letters* 9(4):1497-1500, 2009.
Topinka et al., "Charge Transport in Interpenetrating Networks of Semiconducting and Metallic Carbon Nanotubes," *Nano Letters* 9(5):1866-1871, 2009.
Toyoda et al., "Separation of Semiconducting Single-Walled Carbon Nanotubes by Using a Long-Alkyl-Chain Benzendiazonium Compound," *Chem. Asian J.* 2:145-149, 2007.
Ueno et al., "Colloidal Stability of Bare and Polymer-Grafted Silica Nanoparticles in Ionic Liquids," *Langmuir* 24:5253-5259, 2008.
Unalan et al., "Design Criteria for Transparent Single-Wall Carbon Nanotube Thin-Film Transistors," *Nano Letters* 6(4):677-682, 2006.
Wang et al., "Electronically Selective Chemical Functionalization of Carbon Nanotubes: Correlation between Raman Spectral and Electrical Responses," *J. Am. Chem. Soc.* 127:11460-11468, 2005.
Wang et al., "Metallic Single-Walled Carbon Nanotubes for Conductive Nanocomposites," *J. Am. Chem. Soc.* 130:1415-1419, 2008.
Wei et al., "Selective Enrichment f (6,5) and (8,3) Single-Walled Carbon Nanotubes via Cosurfactant Extraction from Narrow (n,m) Distribution Samples," *The Journal of Physical Chemistry B* 112:2771-2774, 2008.
Yuan et al., "Hysteretic transfer characteristics of double-walled and single-walled carbon nanotube field-effect transistors," *Applied Physics Letters* 91(14):143118, 2007.
Zaumseil et al., "Electron and Ambipolar Transport in Organic Field-Effect transistors," *Chem. Rev.* 107:1296-1323, 2007.
Zhang et al. "Selective Etching of Metallic Carbon Nanotubes by Gas-Phase Reaction," *Science* 314:974-977, Nov. 10, 2006.
Zhao et al., "Solution-processable semiconducting thin-film transistors using single-walled carbon nanotubes chemically modified by organic radical initiators," *Chem. Commun.*46:7182-7184, 2009.
Zheng et al., "DNA-assisted dispersion and separation of carbon nanotubes," *Nautre Materials* 2:338-342, May 2003.
Zheng et al., "Solution Redox Chemistry of Carbon Nanotubes," *J. Am. Chem. Soc.* 126:15490- 15494, 2004.
Zhou et al., "p-Channel, n-Channel Thin Film Transistors and p-n Diodes Based in Single Wall Carbon Nanotube Networks," *Nano Letters* 4(10):2031-2035, 2004.

\* cited by examiner (a)

(b)

METHOD OF MODIFYING ELECTRICAL PROPERTIES OF CARBON NANOTUBES USING NANOPARTICLES

CROSS-REFERENCE TO RELATED APPLICATION

This application claims the benefit of priority of U.S. Provisional Application No. 61/301,791, filed 5 Feb. 2010, the contents of which being hereby incorporated by reference it its entirety for all purposes.

TECHNICAL FIELD

Various embodiments relate to the field of carbon nanotubes, and for example, alternative method of modifying or enhancing the electrical properties of carbon nanotubes.

BACKGROUND

Single-walled carbon nanotubes (SWNTs) have attracted much attention due to their great potential for post-silicon electronics. Ultra-thin SWNT networks have been successfully demonstrated as promising and low-cost materials for field-effect transistors (FETs). Nevertheless, high-performance solution-processable SWNT networks, which are suitable for printable electronics, still demand more investigations. The major hurdle to obtain high-performance SWNT-network FETs is the difficulty in obtaining high mobility and highly semiconducting devices due to the co-existence of metallic (M) and semiconducting (S) tubes in the SWNT-network.

Attempts to separate M-SWNTs and S-SWNTs, to specifically grow S-SWNTs, and to enhance the semiconducting characteristics of the devices by application of chemical treatments on SWNTs or devices, however, are achieved with limited success in high-yield and high-reproducibility of device fabrication. Recently, semiconducting FET devices based on tens-nm-thick SWNT films using the nanotubes treated with density gradient ultra-centrifugation (DGU) or modified with organic diazonium salts, or modified with organic radicals have been fabricated. The advantage of using thick SWNT film (tens-nm thick) is to increase the percolation paths and to reduce the device-to-device variations. But the performance (e.g. mobility) of such devices are compromised by the presence of surfactants. Surfactants are usually used for the device fabrication owing to their high efficiency in dispersing SWNTs. They are widely used for DGU-based and dielectrophoresis-based separation techniques. However, the residual surfactant molecules degrade the electrical performance of SWNT devices by increasing the electrode-nanotube resistance, the local electrostatic environments of the SWNTs, and the inter-tube resistance which is the dominating factor to restrict the conductance of SWNT network.

SUMMARY

Various embodiments provide for an alternative method for enhancing the charge mobility in carbon nanotubes, which overcomes, or at least alleviates, the above problems.

Various embodiments provide a coating layer on SWNT-network FETs which coating layer is able to efficiently screen off the impurity charges from surfactants, and consequently largely enhance the device field effect mobility and suppress their hysteresis.

Various embodiments provide a method of modifying the electrical properties of carbon nanotubes. The method may include:
(i) providing a substrate having carbon nanotubes deposited on a surface of the substrate; and
(ii) depositing on the carbon nanotubes a coating layer having a mixture of nanoparticles, a matrix in which the nanoparticles are dissolved or stabilized, and an ionic liquid.

Various embodiments provide a field-effect transistor. The field-effect transistor may include carbon nanotubes modified by:
(i) providing a substrate having carbon nanotubes deposited on a surface of the substrate; and
(ii) depositing on the carbon nanotubes a coating layer comprising a mixture of nanoparticles, a matrix in which the nanoparticles are dissolved or stabilized, and an ionic liquid.

Various embodiments provide a mixture for forming a coating layer. The mixture may include nanoparticles, a matrix in which the nanoparticles are dissolved or stabilized, and an ionic liquid.

Various embodiments provide a coating layer. The coating layer may include a mixture of nanoparticles, a matrix in which the nanoparticles are dissolved or stabilized, and an ionic liquid.

Various embodiments relate to a use of a mixture including nanoparticles, a matrix in which the nanoparticles are dissolved or stabilized, and an ionic liquid, wherein the mixture may be deposited on carbon nanotubes to modify the electrical properties.

BRIEF DESCRIPTION OF THE DRAWINGS

In the drawings, like reference characters generally refer to the same parts throughout the different views. The drawings are not necessarily drawn to scale, emphasis instead generally being placed upon illustrating the principles of various embodiments. In the following description, various embodiments of the invention are described with reference to the following drawings.

DESCRIPTION

Figure 1:
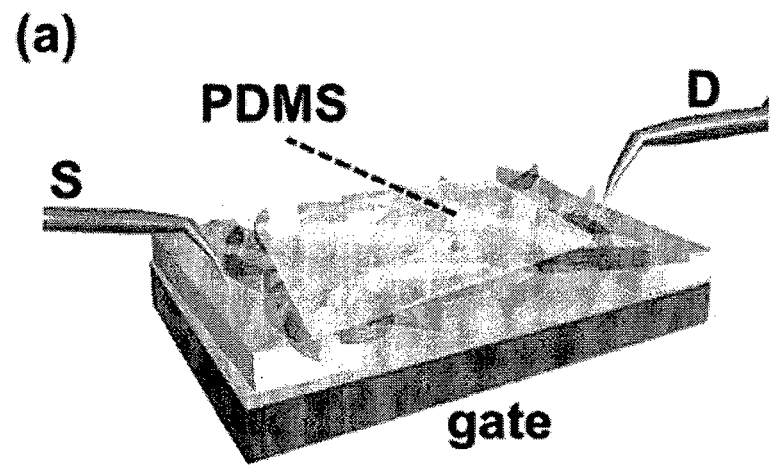
FIG. 1 shows (a) a schematic illustration for a back-gated transistor based on SWNT networks; and (b) transfer characteristics for a transistor of (a) before and after coated with Sylgard@184 silicone elastomer base containing 20 wt % of EMIM-TFSI.
Figure 1:
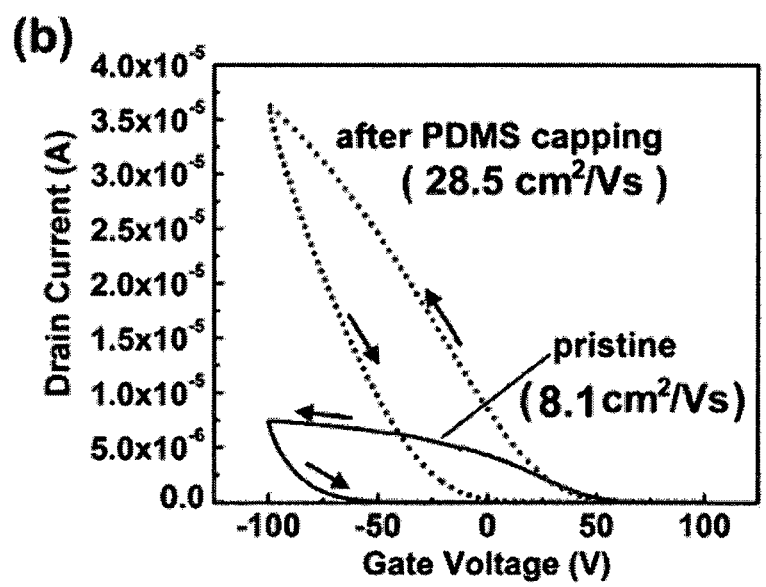

The following detailed description refers to the accompanying drawings that show, by way of illustration, specific details and embodiments in which the invention may be practised. These embodiments are described in sufficient detail to enable those skilled in the art to practise the invention. Other embodiments may be utilized and structural, logical, and electrical changes may be made without departing from the scope of the invention. The various embodiments are not necessarily mutually exclusive, as some embodiments can be combined with one or more other embodiments to form new embodiments.

In the following description non-limiting embodiments of the process will be explained.

According to various embodiments, it has been surprisingly found that the electrical properties of carbon nanotubes may be modified in a simple, cost-effective, and solution-processable method. Various embodiments relate to a method of modifying the electrical properties of carbon nanotubes by depositing a coating layer over the carbon nanotubes. By modifying the electrical properties of carbon nanotubes, improved chemical and physical characteristics may be obtained which increases the possible applications of such modified carbon nanotubes. For example, the mobility of FET devices based on SWNT-networks may increase 3 to 4 times after coating, and at the same time the hysteresis may be significantly reduced. The enhancement of electrical properties may be due to the screening effect of the charges from residual surfactant molecules by the coating. The pronounced enhancement in the field-effect mobility and decrease of hysteresis of SWNT network devices were achieved simply by coating a layer of a matrix containing dissolved or stabilized nanoparticles and liquid ions. The method allows a 3 to 4 fold increment of mobility to be achieved. The use of surfactants in aqueous solutions is presently the most efficient manner to disperse SWNTs for solution-based fabrication processes. Although the thermal annealing may be used to burn off the surfactants to a certain extent, the annealing usually degrades rather than enhances the device mobility. The current absence of practical surfactant-free processes makes the present approach very useful in fabrication of high-performance devices.

Generally, a nano-structured material, such as nanotubes, refers to a material with dimensions in the nanometer range. Nano-structured materials can be classified into the following dimensional types: Zero dimensional (0D): nanospherical particles (also called nanoparticles); one dimensional (1D): nanorods, nanowires (also called nanofibers) and nanotubes; and two dimensional (2D): nanoflakes, nanoflowers, nanodiscs and nanofilms.

A carbon nanotube as used in various embodiments may be a cylinder of rolled up graphitic sheets. Single-, double- and multi-walled carbon nanotubes are known and can equally be used in the method of the present invention. The carbon nanotubes may be of any desired length, such as in the range from about 0.1 nm to about 10 µm, such as from about 1 nm to about 5 µm or from 10 nm to about 1 µm. In various embodiments, the carbon nanotubes may have a length of at most about 2 µm or a length in the range from about 0.5 µm to about 2 µm or from about 1 µm to about 2 µm. The conductivity of the carbon nanotubes used may be freely selected according to any specific requirements. Depending on the arrangement of the carbon hexagon rings along the surface of the nanotubes, carbon nanotubes can be metallic or semiconducting. Any such carbon nanotubes may be used in a method according to various embodiments.

Carbon nanotubes exist in different forms, such as single-walled carbon nanotubes (SWNT), double-walled carbon nanotubes (DWNT), multi-walled carbon nanotubes (MWNT), or modified multi-walled carbon nanotubes. Although various embodiments described herein relate to SWNT, it is to be understood and appreciated that other forms or configurations of the carbon nanotubes may also be useful.

A SWNT is a seamless cylinder formed from one graphite layer. For example, carbon nanotubes can be described as a graphite plane (so called graphene) sheet rolled into a hollow cylindrical shape so that the structure is one-dimensional with axial symmetry, and in general exhibiting a spiral conformation, called chirality. A single-wall nanotube can be defined by a cylindrical sheet with a diameter of about 0.7 to about 20 nm, such as about 1 to about 20 nm.

A DWNT has two layers of graphite sheets rolled in to form a tube shape. The two layers of graphite sheets can form a concentric cylinder. The nanotubes are considered as a cross between SWNT and MWNT as they can have the electronic properties of the SWNT, and the mechanical strength of MWNT. DWNT may be semi-conducting or metallic.

A MWNT has multiple layers of graphite rolled in on to form a tube shape. The nanotubes can also exist in forms in which they have hydrophilic groups such as hydroxyl group, pyrenes, esters, thiols, amines, a carboxyl group and mixtures thereof on their surface.

Carbon nanotubes may be prepared by several different methods known in the art. For example, SWNT may be grown by carbon monoxide (CO) disproportionation (decomposition into C and $CO_2$) at 700-950° C. in flow of pure CO at a total pressure that typically ranges from 1 to 10 atm using a catalyst comprising cobalt (Co) and molybdenum (Mo) on a mesoporous silica support, leading to so-called CoMoCAT® SWNTs. Using this method, diameter control of SWNTs can be achieved. Another possibility is the synthesis using high pressure carbon monoxide (HiPCo) leading to so-called HiPco SWNTs. Generally, in a HiPco method, metal catalyst is formed in situ when $Fe(CO)_5$ or $Ni(CO)_4$ is injected into a reactor along with a stream of CO gas at a temperature range of about 900-1100° C. at a pressure of about 30 to 50 atm. The metal catalyst formed can be in the form of nanometer sized particles. HiPco SWNTs may be produced following the disproportionation of CO by the metal catalyst particles. In various embodiments, all types of SWNTs may be used for the enrichment process. In various embodiments, CoMoCAT® and HiPco SWNTs were used to demonstrate the usability of the polymers described herein.

Various embodiments provide a method of modifying the electrical properties of carbon nanotubes. The method may include:
(i) providing a substrate having carbon nanotubes deposited on a surface of the substrate; and
(ii) depositing on the carbon nanotubes a coating layer including a mixture of nanoparticles, a matrix in, which the nanoparticles are dissolved or stabilized, and an ionic liquid.

A thin coating layer of the mixture containing nanoparticles, a matrix in which the nanoparticles are dissolved or stabilized, and an ionic liquid coated on SWNT network FETs is able to efficiently screen off the impurity charges from surfactants, and consequently largely enhance the device field effect mobility and suppress their hysteresis. The Hall effect measurements also corroborate the large enhancement in mobility after coating. This simple strategy promises applications in high-performance and printable SWNT-based macroelectronics.

In various embodiments, the carbon nanotubes are single-walled carbon nanotubes. The single-walled carbon nanotube of the invention may be used as field-effect transistor (FET) device.

Thus, various embodiments further provide a method for manufacturing a field-effect transistor. The method may include:
(i) modifying the electrical properties of at least one carbon nanotube, the modifying comprising:
providing a substrate having carbon nanotubes deposited on a surface of the substrate; and
depositing on the carbon nanotubes a coating layer comprising a mixture of nanoparticles, a matrix in which the nanoparticles are dissolved or stabilized, and an ionic liquid;
(ii) forming the field-effect transistor using the at least one modified carbon nanotube as an active area of the field-effect transistor, in which active area a conductive channel may be formed.

FIG. 1a shows a schematic illustration of a back-gated FET based on SWNT networks, prepared using the nanotubes modified by, for example, organic radicals. Basically, the FET structure involves two metal electrodes designated as "source" (S) and "drain" (D) connected by a semiconducting active area, on which a semiconducting or conductive channel may be formed in response of suitable electrical potentials at the source, the drain and the gate of the FET structure. The metal electrodes and the conductive channel may be formed on a top surface of a substrate. The substrate may be a SiO$_2$/Si substrate, for example. In conventional FET devices, the conductive channel may be made of Si. In the FET of various embodiments, the conductive channel may be replaced by carbon nanotubes modified according to various embodiments. The FET using carbon nanotubes as an active area of the FET that is made with the modified carbon nanotubes according to various embodiments exhibits high semi-conducting characteristics.

One advantage of various embodiments is that the modification method is simple, low-cost, scalable, safe, and with high yield and high quality. The FET devices may show higher mobility after deposition of a coating layer of the invention. The FETs obtained with the modified carbon nanotubes of various embodiments may find applications in macroelectronics, printable electronics (such as ink jet printed electronics), and flexible electronics.

The SWNTs modified according to various embodiments may be used in addition to the above in several applications, for example as electronic component. Examples of further applications of carbon nanotubes include, but are not limited to, conductive and high-strength nanotube/polymer composites, catalysts, transparent electrodes, sensors and nanoelectromechanical devices, additives for batteries, radiation sources, semiconductor devices in general (e.g. transistors, see above), ultracapacitors or interconnects. In an illustrative example of such further applications, the use of metallic carbon nanotubes (whether single-walled or multi-walled tubes) in the fabrication of transparent conductive electrodes for photovoltaic applications has been investigated recently for their potential to address some of the shortcomings of current indium tin oxide electrodes. In particular, metallic carbon nanotubes modified according to various embodiments of the present method may show modified electrical properties such as enhanced conductivity suitable for use as conductive electrodes.

A coating layer is then deposited on the carbon nanotubes. The coating layer may include a mixture of nanoparticles, a matrix in which the nanoparticles are dissolved or stabilized, and an ionic liquid. The coating layer may be deposited directly on the SWNT network in ambient.

In various embodiments, the nanoparticles may be selected from the group consisting of silica, ZnO, TiO$_2$, Al$_2$O$_3$, Fe$_3$O$_4$, Fe$_2$O$_3$, clay, opal, glass, aerogel, and mixtures thereof. It is to be understood and appreciated that other small-sized particles which can be stabilized in a matrix to provide enhanced field-effect mobility and decrease hysteresis of SWNT network devices are also useful.

In one embodiment, the nanoparticles are silica. For example, the nanoparticles may be dimethylvinylated and trimethylated silica nanoparticles.

In various embodiments, the matrix in which the nanoparticles may be dissolved or stabilized may include an elastomer.

In various embodiments, the matrix may be a silicone elastomer.

In various embodiments, the matrix may be polydimethylsiloxane (PDMS).

It is to be understood and appreciated that other solvent systems that are able to dissolve or stabilize the nanoparticles may also work as suitable matrices.

In various embodiments, the ionic liquid may be an organic azolium salt.

In various embodiments, the ionic liquid may be 1-ethyl-3-methylimidazolium bis(trifluoromethylsulfonyl)imide (EMIM-TFSI). The chemical structure of EMIM-TFSI may be illustrated as follows:

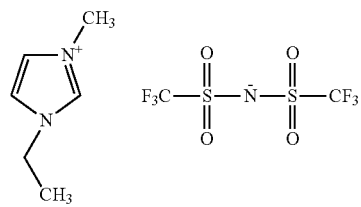

The mixture including the nanoparticles, a matrix in which the nanoparticles are dissolved or stabilized, and an ionic liquid may be mixed prior to coating on carbon nanotubes.

In various embodiments, the nanoparticles may be dissolved in the matrix prior to mixing with the ionic liquid.

In various embodiments, the matrix having dissolved or stabilized nanoparticles therein may be a silicone elastomer base.

In one embodiment, the matrix having dissolved or stabilized nanoparticles therein may be Sylgard@184 (Dow Corning Corporation).

In various embodiments, the mixing prior to coating may be carried out by standard mixing methods known in the art. Any suitable mixing device may be used, wherein the embodiments are not limited to a particular device. In various embodiments, the mixing may be carried out, but is not limited to, by stirring or shaking the mixture.

In various embodiments, the mixing may be carried out for about 1 to about 30 minutes, such as about 1 to about 20 minutes or about 1 to about 15 minutes. For example, the mixing time may be about 15 minutes. All mentioned time specifications may be the lower or upper limit of a respective time range.

In order that the embodiments may be readily understood and put into practical effect, particular embodiments will now be described by way of the following non-limiting example.

EXAMPLE

Fabrication of Single-Walled Carbon Nanotubes-based Field-Effect Transistor

Carbon nanotubes, SWeNT@SG 65, were purchased from SouthWest Nanotechnologies (USA) and were used without further purification. The solution for semiconducting device fabrication was based on controlled chemical modification of CoMoCat SWNTs with radicals produced by an organic radical initiator, 1,1'-azobis (cyanocyclohexane) (ACN). Briefly, 0.3 mg of SWNTs was dispersed in 30 mL of DMF solution via probe-ultrasonication for 30 min (Sonics & Materials Inc., Model: VCX 130). Then, 1 mL of DMF solution containing 25 mg/mL ACN was added to 10 mL SWNT suspension, followed by 30 min ultrasonication. After reaction with ACN, the suspension was filtered through a 0.25 μm PTFE membrane, followed by repeated washing with DMF and acetone to remove the residuals. The powders collected from PTFE membrane were re-dispersed in a 2 wt % of co-surfactants which consists of sodium dodecyl sulfate (SDS) and sodium cholate hydrate (SC) (weight ratio=1:4). The nanotube bundles in the suspension were removed by centrifugation at 20000 rpm for 90 min. The resulting supernatant was then used for fabrication of thin-film field-effect transistors (FETs).

The SWNT FETs (SNFETs) were fabricated by drop-casting the suspension of modified SWNTs across two Au electrodes (100 nm thick) pre-patterned on top of $SiO_2$/Si substrate to form conducting channel approximately 50 μm long and approximately 25 μm wide. The gate dielectrics $SiO_2$ is 300 nm thick. For the drop-cast procedure, 25 μL of SWNT suspension was dropped onto the devices, followed by drying at room temperature and rinsing of de-ionized water. The procedure was repeated until the density of ACN-functionalized SWNTs is high enough to reach the desired current level. Furthermore, all electrical measurements were carried out in ambient conditions using a Keithley semiconductor parameter analyzer Model 4200-SCS. The extraction of field effect mobility was based on the slope of the transfer curve.

To investigate the mobility enhancement effect, the PDMS elastomer, Sylgard@184 silicone elastomer base (1 g; Dow corning corporation, Midland, Mich., USA), was firstly mixed with various amounts of 1-ethyl-3-methylimidazolium bis(trifluoromethylsulfonyl)imide (EMIM-TFSI)) under continuous stirring for 15 min before coating. Then the mixture was coated on SWNT network transistor directly in ambient. For the mechanism study part, silica nanoparticles (particle size: 7 nm; surface area: 390±40 $m^2$ per gram) are from Sigma-Aldrich. Pure PDMS, poly(dimethylsiloxane) with methoxy terminated (Average $M_w$, approximately 27000) is also purchased from Sigma-Aldrich.

Electrical Measurements and Characteristic Studies

Figure 2:
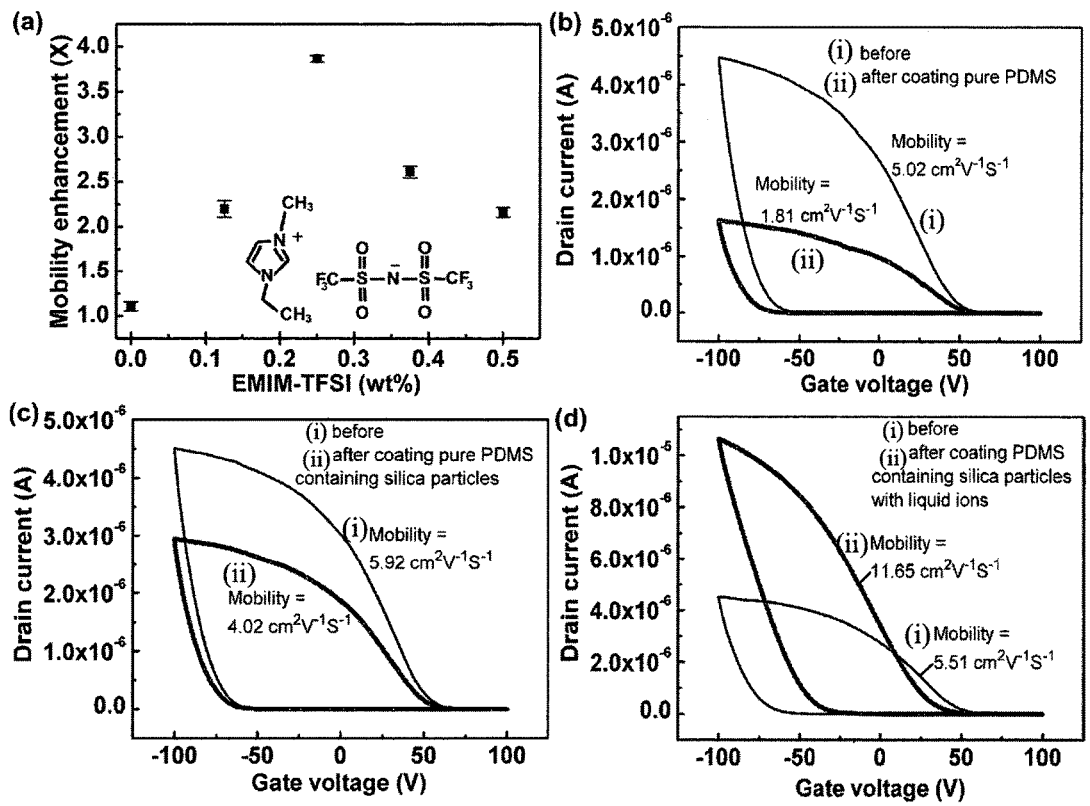
FIG. 2 shows (a) effect of the wt % of EMIM-TFSI added to the Sylgard@184 silicone elastomer matrix (1 g) on the mobility enhancement ratio for the SWNT transistors (the SWNT network transistors tested were with initial mobility at approximately 5-8 $cm^2/Vs$); and transfer curves for the devices before and after coated with (b) pure PDMS, (c) PDMS with silica nanoparticles and (d) PDMS with silica nanoparticles and EMIM-TFSI.

FIG. 1b displays the transfer curves (drain current $I_d$ vs. gate voltage $V_g$) of the SWNT-network FET before and after depositing a layer of Sylgard@184 silicone elastomer base mixed with 20 wt % of (1-ethyl-3-methylimidazolium bis (trifluoromethylsulfonyl)imide) (EMIM-TFSI; chemical structure shown in FIG. 2a).

Figure 3:
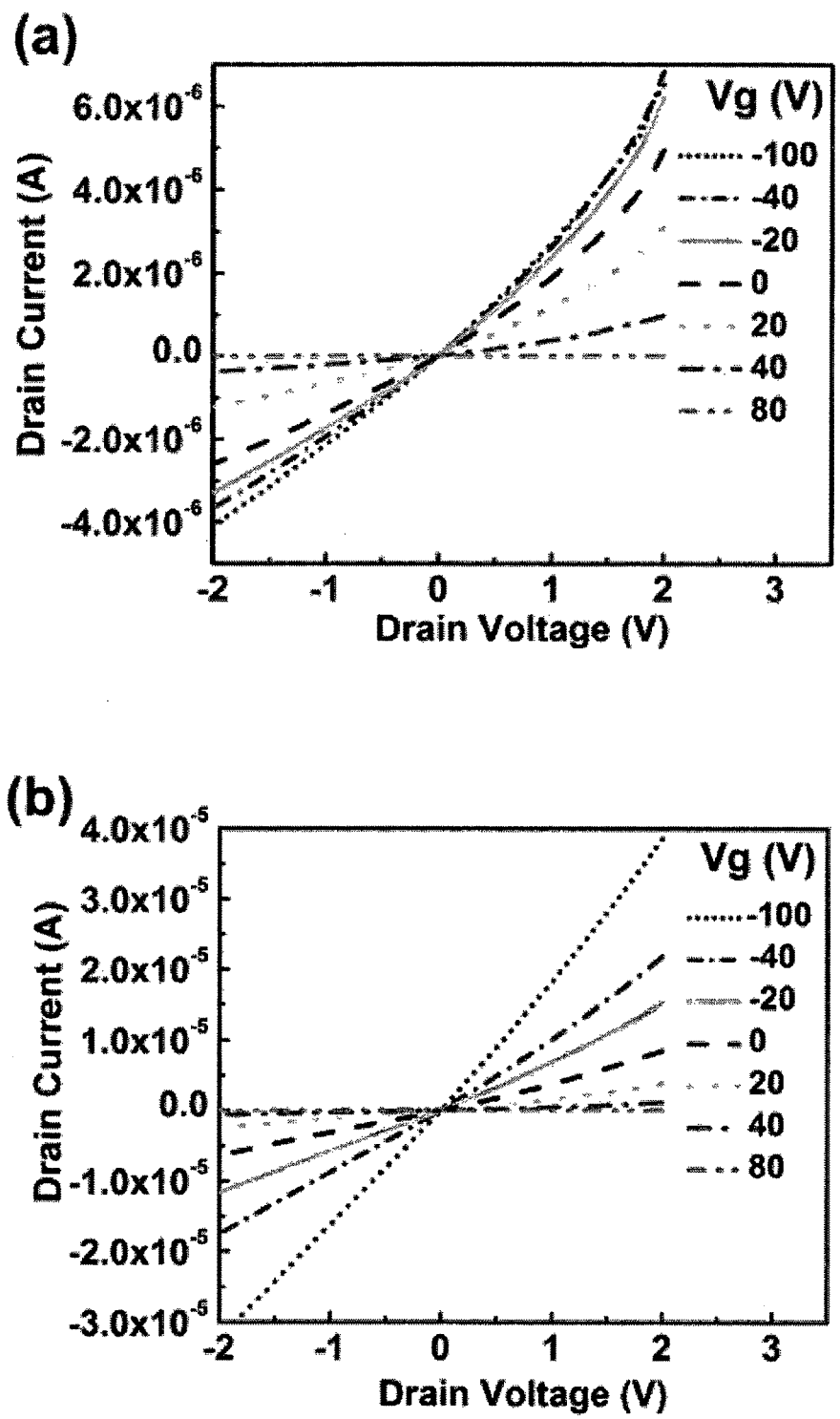
FIG. 3 shows the output characteristics ($I_d$ vs. drain voltage $V_d$) of the transistor (a) before and (b) after laying down the mixture. The slightly rectifying (asymmetric) I-V curve shown in (a) suggests that the pristine device exhibited Schottky-like contacts likely at metal-SWNT interface. The I-V curves become linear after coated with the mixture.
Figure 4:
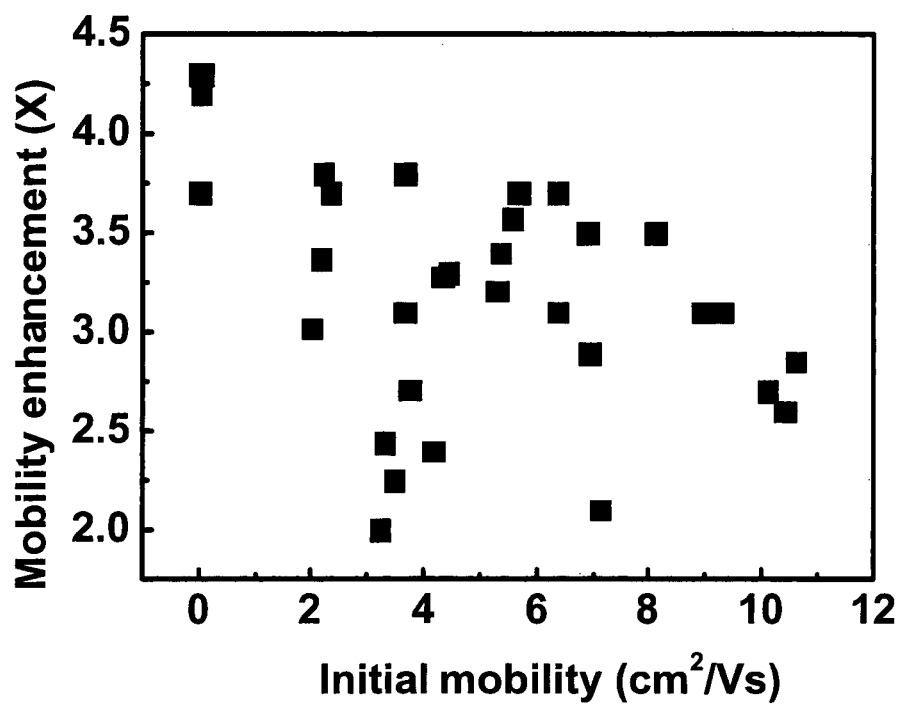
FIG. 4 shows the mobility enhancement factor plotted as a function of the initial device mobility. The initial mobility of the transistors ranges from 0.015 to 10.8 $cm^2/Vs$.
Figure 5:
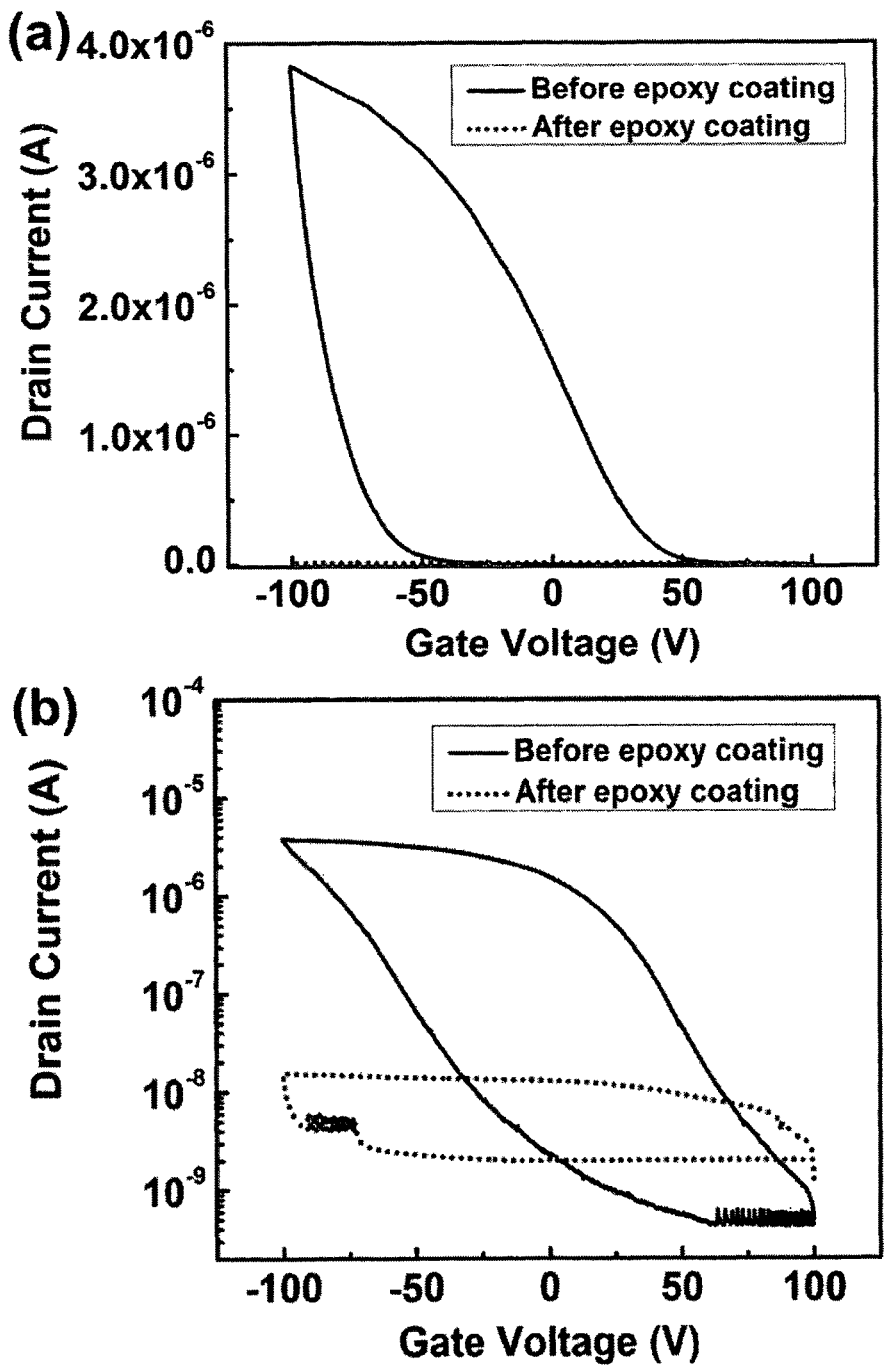
FIG. 5 shows the typical transfer characteristics for a transistor before and after coated with epoxy (MR 4H A/B, Miradur, Singapore).

The Sylgard@184 silicone elastomer base is a viscous fluid, composed of PDMS (>60%) and dimethylvinylated and trimethylated silica nanoparticles, and it becomes opaque after adding EMIM-TFSI. The mobility of the pristine device increased significantly from 8.1 $cm^2$/Vs to 28.5 $cm^2$/Vs after covering with the silicone/EMIM-TFSI mixture. The output characteristics for this device were shown in FIG. 3. It is noted that the field effect mobility was extracted based on the slope of the transfer curve as described in Chem. Rev., 2007, 107(4), 1296-1323 and the $V_g$ scan was taken from positive to negative voltage for mobility extraction. Such a mobility enhancement effect was observed on the transistor devices with wide range of mobility from 0.015 $cm^2$/Vs to approximately 10.8 $cm^2$/Vs as shown in FIG. 4. This is also similarly observed for the devices prepared from other sources of SWNTs including commercially available CoMoCAT, HiPCO and Arc-discharge based tubes. The mobility enhancement may be unique to the silicone/EMIM-TFSI system. Other types of coatings, such as water, organic solvents, epoxy resins, thermal glues, polyethylamine, polymethacrylic acid and different photoresists have been tested, but these materials generally caused decrease in the device mobility (FIG. 5).

FIG. 2a shows that the mobility enhancement ratio (the enhanced mobility to the initial mobility) for the SWNT network transistors strongly depends on the amount of EMIM-TFSI added to the Sylgard@184 silicone elastomer base. The mobility enhancement occurs once the silicone liquid turns opaque. As no crosslinking reagent was added to the silicone elastomer base, the induced opacity is not related to the gelation or crosslink of PDMS polymer chains. Instead, the opacity is likely resulted from the aggregation of the silica nanoparticles in the mixture, which will be discussed later.

It is arguable that the mobility increase could be due to the changes in environmental dielectrics, i.e. from the dielectric constant approximately 1 (in air) to approximatelt 2.5 (in PDMS). Dielectric-enhanced mobility has been reported for graphene based transistors. However, the results in FIG. 2b (coating with pure PDMS) clearly suggest that the dielectric change is also not a dominating factor. To further clarify the causes of mobility enhancement, it is confirmed that PDMS added with only silica nanoparticles (without EMIM-TFSI) (FIG. 2c) or PDMS with EMIM-TFSI (without silica) (data not shown) both reduced the device mobility. The mobility enhancement was only observed when the PDMS layer was mixed with both silica nanoparticles and EMIM-TFSI as shown in FIG. 2d. Taken all the observations described, the aggregation of silica nanoparticles induced by liquid ions EMIM-TFSI seems to play the key role in enhancing the mobility, while the PDMS layer serves as the matrix to host silica nanoparticles and liquid ions.

Figure 6:
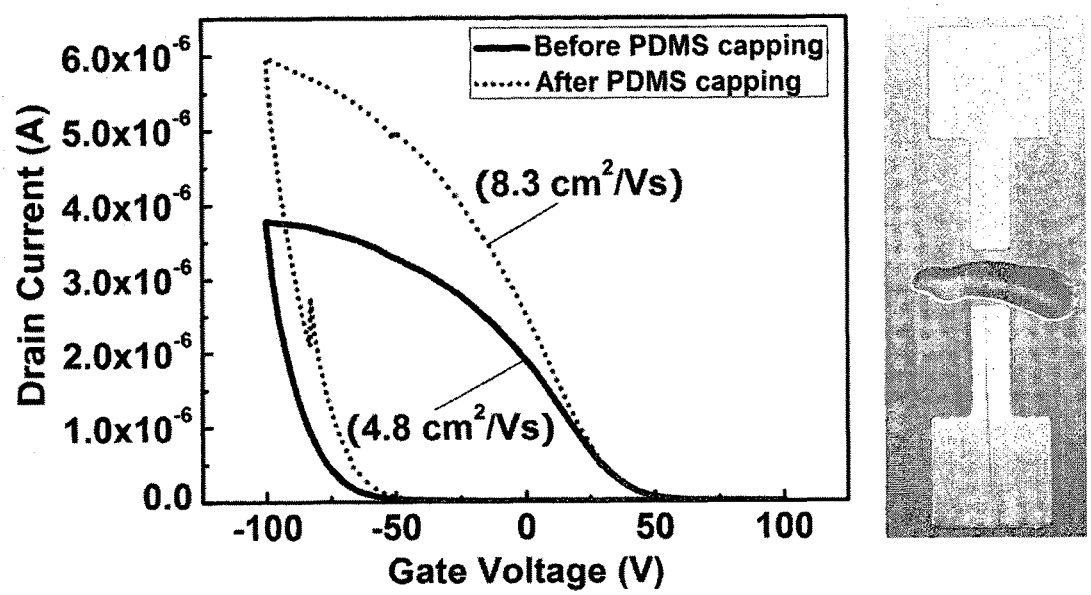
FIG. 6 shows the transfer curves for a SWNT network transistor before and after coated with PDMS layer (with silica nanoparticles and EMIM-TFSI) at the center of the channel.

To further understand the mechanism, the coating at the center of the conducting channel without covering the metal-SWNT junctions was tested. As shown in FIG. 6, the mobility can still be enhanced even when the coating is limited to the conducting channel, suggesting that the observed effects are essentially related to conducting channels.

Figure 7:
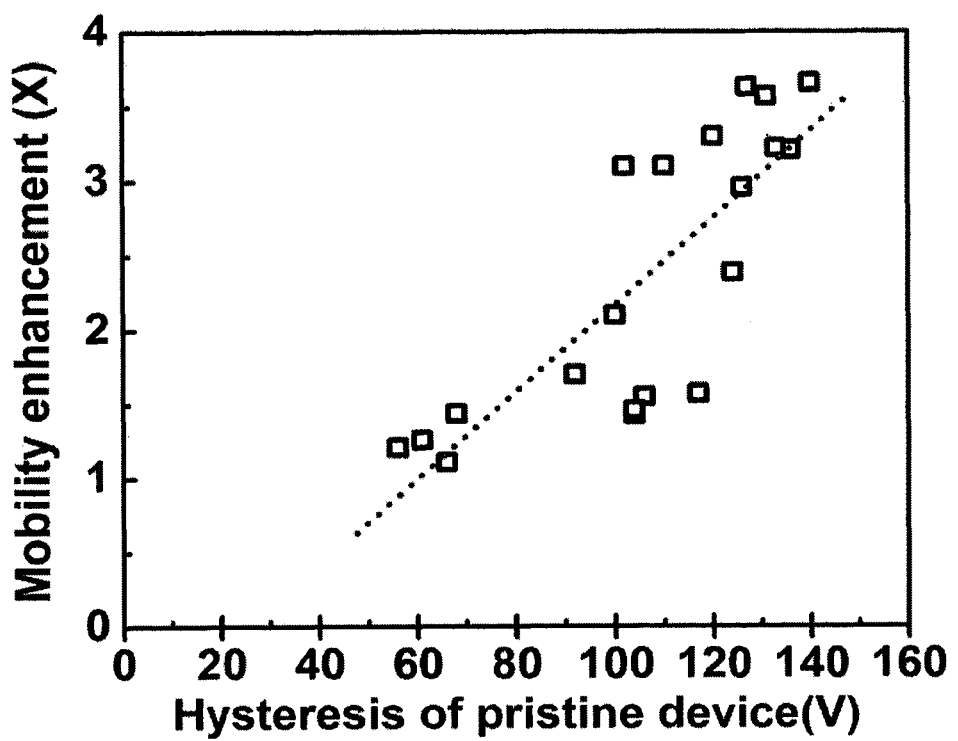
FIG. 7 shows the mobility enhancement ratio is positively related to the initial hysteresis of the SWNT network transistors. Data points include both the devices coated with non-crosslinkable Sylgard@184 silicone elastomer base containing 20 wt % of EMIM-TF SI and those with RTV enhanced times of mobility after coating with PDMS.
Figure 8:
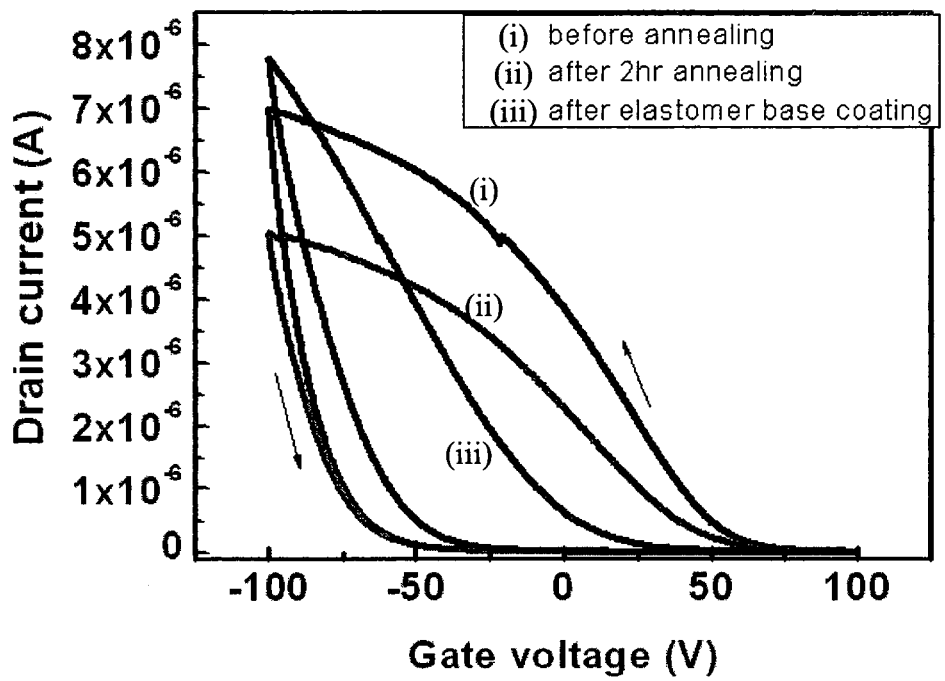
FIG. 8 shows (a) the typical transfer curves for the SWNT network transistor before and after annealing in air at 260° C. for 2 h, and after coating elastomer base containing 20 wt % of EMIM-TFSI; (b) the effect of the annealing time (at 260° C. in air) for the pristine transistors on the mobility enhancement ratio after coating Sylgard@184 silicone elastomer base added with 20 wt % of EMIM-TFSI.
Figure 8:
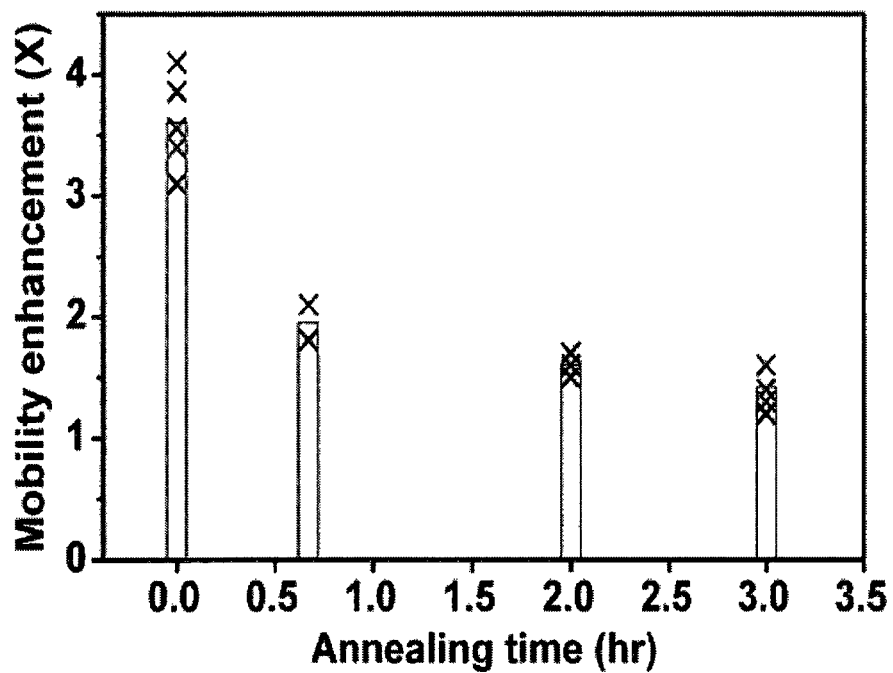

The results shown in FIG. 1 have revealed that the mobility enhancement occurs simultaneously with the hysteresis change. FIG. 7 shows that the mobility enhancement ratio was less significant when the hysteresis of the pristine transistor (before coating) was smaller, where the hysteresis was quantified based on the method reported in *J. Phys. Chem. C.* 2009, 113, 4745-4747. The hysteresis in SWNT transistors is caused by the trapped charges between SWNTs and environmental dielectrics or charges introduced by residual surfactants. It has been verified that the coating with pure PDMS polymers does not change the hysteresis of the present devices (FIG. 2b). Hence, the observed hysteresis reduction is not resulted from the change of environmental dielectrics. Instead, it is likely due to suppression of the influences from the residual surfactants. This notion is further corroborated by a separate experiment that thorough water rinsing to reduce the residual surfactants led to lower enhancement ratio of approximately 2.3 as compared to that from devices without thorough rinsing (approximately 4.2). Furthermore, the pristine devices were annealed at 260° C. in air for various time periods to burn off (or oxidize) the residual surfactants. As expected, with the increasing annealing time, the devices exhibit a lower mobility enhancement ratio after coating silicone/EMIM-TFSI (FIG. 8)

To further clarify the effect of silicone/EMIM-TFSI coating, Hall effect measurement based on Van der pawl method (*Philips Research Reports*, 1958, 13, 1-9) was performed to extract the mobility, carrier concentration, and sheet resistance of the SWNT networks (1 cm×1 cm). Table 1 shows that the extracted Hall mobility for all these films increases after coating, consistent with the FET device results. In general, the sheet resistance slightly increases after coating, which is consistent with the observation of output characteristics in FIG. 3. The sheet resistance increase is due to the decrease of hole concentration after coating, indicating that the screening of the negatively charged surfactants also reduces the hole concentration in SWNTs. Silica nanoparticles carry positive surface charges in a neutral environment and the interparticle electrostatic repulsion keeps them well separated and dispersed in PDMS. With the incorporation of liquid ions, the interparticle electrostatic repulsion appeared to be inefficient, due to the extensively high ionic strength of the liquid ions and the resulting surface-charge screening. Hence, silica nanoparticles tend to form clusters or aggregations, resulting in its opacity in PDMS as observed. It is believed that the negative ions, from residual surfactants around SWNTs may be attracted by or trapped into the silica-liquid ion aggregations, leading to the screening of charge from surfactants and the enhancement of effective mobility of the SNFETs.

TABLE 1

Parameters extracted from Hall effect measurements.

| Sample | Process | Mobility ($cm^2$/Vs) | Sheet resistance (Ohm/sq.) | Hole conc. (/$cm^2$) |
|---|---|---|---|---|
| 1 | Before | 8.07 | $8.51 \times 10^5$ | $9.45 \times 10^{11}$ |
|   | After  | 24.71 | $7.35 \times 10^5$ | $4.32 \times 10^{11}$ |
| 2 | Before | 7.63 | $2.19 \times 10^6$ | $8.58 \times 10^{11}$ |
|   | After  | 25.40 | $2.43 \times 10^6$ | $1.33 \times 10^{11}$ |
| 3 | Before | 2.73 | $2.56 \times 10^6$ | $1.04 \times 10^{12}$ |
|   | After  | 4.44 | $3.15 \times 10^6$ | $4.81 \times 10^{11}$ |
| 4 | Before | 1.67 | $1.20 \times 10^6$ | $3.18 \times 10^{12}$ |
|   | After  | 3.41 | $1.29 \times 10^6$ | $1.45 \times 10^{12}$ |
| 5 | Before | 1.46 | $4.37 \times 10^5$ | $1.05 \times 10^{13}$ |
|   | After  | 6.24 | $6.80 \times 10^5$ | $1.69 \times 10^{12}$ |

The embodiments illustratively described herein may suitably be practiced in the absence of any element or elements, limitation or limitations, not specifically disclosed herein. Thus, for example, the terms "comprising", "including", "containing", etc. shall be read expansively and without limitation. Additionally, the terms and expressions employed herein have been used as terms of description and not of limitation, and there is no intention in the use of such terms and expressions of excluding any equivalents of the features shown and described or portions thereof, but it is recognized that various modifications are possible within the scope of the invention claimed. Thus, it should be understood that although the present invention has been specifically disclosed by specific embodiments and optional features, modification and variation of the inventions embodied therein herein disclosed may be resorted to by those skilled in the art, and that such modifications and variations are considered to be within the scope of this invention.

The invention has been described broadly and generically herein. Each of the narrower species and subgeneric groupings falling within the generic disclosure also form part of the invention. This includes the generic description of the invention with a proviso or negative limitation removing any subject matter from the genus, regardless of whether or not the excised material is specifically recited herein.

Other embodiments are in the following claims. In addition, where features or aspects of the invention are described in terms of Markush groups, those skilled in the art will recognize that the invention is also thereby described in terms of any individual member or subgroup of members of the Markush group.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

The invention claimed is:

1. A method of modifying electrical properties of carbon nanotubes, comprising:
   providing a substrate having carbon nanotubes deposited on a surface of the substrate; and
   depositing on the carbon nanotubes a coating layer comprising a mixture of nanoparticles, a matrix in which the nanoparticles are dissolved or stabilized, and an ionic liquid, the coating layer modifying the electrical properties of the carbon nanotubes, wherein the ionic liquid is incorporated in the matrix such that the matrix hosts the nanoparticles and the ionic liquid therein, and wherein the mixture of the nanoparticles, the matrix in which the nanoparticles are dissolved or stabilized, and the ionic liquid is mixed prior to coating on carbon nanotubes.

2. The method of claim 1, wherein the nanoparticles are selected from the group consisting of silica, ZnO, $TiO_2$, $Al_2O_3$, $Fe_3O_4$, $Fe_2O_3$, clay, opal, glass, aerogel, and mixtures thereof.

3. The method of claim 2, wherein the nanoparticles comprise silica.

4. The method of claim 3, wherein the silica nanoparticles comprise dimethylvinylated and trimethylated silica nanoparticles.

5. The method of claim 1, wherein the matrix comprises an elastomer.

6. The method of claim 5, wherein the elastomer comprises silicone.

7. The method of claim 6, wherein the silicone elastomer comprises polydimethylsiloxane.

8. The method of claim 1, wherein the ionic liquid comprises an organic azolium salt.

9. The method of claim 8, wherein the ionic liquid is 1-ethyl-3-methylimidazolium bis(trifluoromethylsulfonyl) imide.

10. The method of claim 1, wherein the carbon nanotubes comprise single-walled carbon nanotubes.

11. The method of claim 1, wherein the substrate forms part of a transistor or resistor.

12. The method of claim 11, wherein the substrate forms part of a field-effect transistor.

13. The method of claim 1, wherein the coating layer is deposited in ambient.

14. The method of claim 1, wherein the mixture is mixed for about 1 to about 30 minutes prior to coating on carbon nanotubes.

15. The method of claim 1, wherein the nanoparticles are dissolved in the matrix prior to mixing with the ionic liquid.

16. The method of claim 15, wherein the matrix is a silicone elastomer base.

17. The method of claim 1, wherein the substrate forms part of a conductive electrode.

18. A method for manufacturing a field-effect transistor, the method comprising:
   modifying electrical properties of at least one carbon nanotube, the modifying comprising:
   providing a substrate having carbon nanotubes deposited on a surface of the substrate; and
   depositing on the carbon nanotubes a coating layer comprising a mixture of nanoparticles, a matrix in which the nanoparticles are dissolved or stabilized, and an ionic liquid, wherein the ionic liquid is incorporated in the matrix such that the matrix hosts the nanoparticles and the ionic liquid therein, and wherein the mixture of the nanoparticles, the matrix in which the nanoparticles are dissolved or stabilized, and the ionic liquid is mixed prior to coating on carbon nanotubes;
   forming the field-effect transistor, the forming including using the at least one modified carbon nanotube to form a conductive channel at an active area of the field-effect transistor.

* * * * *

UNITED STATES PATENT AND TRADEMARK OFFICE
CERTIFICATE OF CORRECTION

PATENT NO. : 10,077,189 B2
APPLICATION NO. : 13/577223
DATED : September 18, 2018
INVENTOR(S) : Jianwen Zhao et al.

Page 1 of 1

It is certified that error appears in the above-identified patent and that said Letters Patent is hereby corrected as shown below:

On the Title Page

Page 3, Item (56) References Cited, OTHER PUBLICATIONS, Column 1, 3$^{rd}$ reference from the top:
"Rinkiii et al.," should read --Rinkiö et al.,--

Signed and Sealed this
Sixteenth Day of July, 2019

Andrei Iancu
*Director of the United States Patent and Trademark Office*